United States Patent
Sunter et al.

(10) Patent No.: US 7,219,282 B2
(45) Date of Patent: May 15, 2007

(54) BOUNDARY SCAN WITH STROBED PAD DRIVER ENABLE

(75) Inventors: Stephen K. Sunter, Nepean (CA); Pièrre Gauthier, Gatineau (CA); Benoit Nadeau-Dostie, Gatineau (CA)

(73) Assignee: LogicVision, Inc., San Jose, CA (US)

( * ) Notice: Subject to any disclaimer, the term of this patent is extended or adjusted under 35 U.S.C. 154(b) by 494 days.

(21) Appl. No.: 10/701,479

(22) Filed: Nov. 6, 2003

(65) Prior Publication Data

US 2004/0098648 A1 May 20, 2004

Related U.S. Application Data

(60) Provisional application No. 60/425,994, filed on Nov. 14, 2002.

(51) Int. Cl.
*G01R 31/28* (2006.01)
(52) U.S. Cl. .................................... 714/727; 714/726
(58) Field of Classification Search ................ None
See application file for complete search history.

(56) References Cited

U.S. PATENT DOCUMENTS

| | | | |
|---|---|---|---|
| 5,029,166 A | 7/1991 | Jarwala et al. | |
| 5,513,186 A * | 4/1996 | Levitt | 714/727 |
| 5,513,188 A | 4/1996 | Parker et al. | |
| 5,627,837 A | 5/1997 | Gillett | |
| 5,627,839 A | 5/1997 | Whetsel | |
| 5,656,953 A * | 8/1997 | Whetsel | 326/83 |
| 5,706,296 A | 1/1998 | Whetsel | |
| 5,726,999 A * | 3/1998 | Bradford et al. | 714/727 |
| 5,732,091 A | 3/1998 | Whetsel | |
| 5,736,849 A * | 4/1998 | Terayama | 324/158.1 |
| 5,744,949 A * | 4/1998 | Whetsel | 324/158.1 |
| 5,852,617 A | 12/1998 | Mote, Jr. | |
| 5,872,796 A * | 2/1999 | Golshan et al. | 714/727 |
| 5,872,908 A * | 2/1999 | Whetsel | 714/30 |
| 5,938,783 A * | 8/1999 | Whetsel | 714/726 |
| 6,000,051 A * | 12/1999 | Nadeau-Dostie et al. | 714/727 |
| 6,055,659 A | 4/2000 | Whetsel | |
| 6,108,807 A * | 8/2000 | Ke | 714/726 |
| 6,163,864 A | 12/2000 | Bhavsar et al. | |
| 6,219,812 B1 | 4/2001 | Golshan | |
| 6,266,801 B1 * | 7/2001 | Jin | 716/8 |
| 6,499,124 B1 * | 12/2002 | Jacobson | 714/727 |
| 6,574,762 B1 | 6/2003 | Karimi et al. | |
| 6,586,921 B1 | 7/2003 | Sunter | |
| 6,601,197 B1 | 7/2003 | Naritake | |
| 6,925,583 B1 * | 8/2005 | Khu et al. | 714/30 |
| 2003/0159124 A1 * | 8/2003 | Fisher | 716/18 |

OTHER PUBLICATIONS

IEEE Standard Test Access Port and Boundary-Scan Architecture; IEEE Std1149.1-1990.*

* cited by examiner

*Primary Examiner*—Albert Decady
*Assistant Examiner*—Steve Nguyen
(74) *Attorney, Agent, or Firm*—Eugene E. Prouix

(57) ABSTRACT

A circuit and a method are provided for testing the enable function of Boundary Scan Register bits that control the driver of unconnected I/O pins of an 1149.1-compliant IC during the IC's reduced pin-count access manufacturing test, and to test the connections to these pins during the test of a circuit board containing the IC, without causing excessive current if a pin is inadvertently short circuited.

7 Claims, 10 Drawing Sheets

BOUNDARY SCAN WITH STROBED PAD DRIVER ENABLE

CROSS-REFERENCE TO RELATED APPLICATIONS

This application claims the benefit of U.S. Provisional Patent Application Ser. No. 60/425,994 filed Nov. 14, 2002.

BACKGROUND OF THE INVENTION

1. Field of the Invention

The present invention relates, in general, to the testing of integrated circuits (ICs) and, more specifically, to a method and circuit for testing integrated circuit (IC) output pin circuitry, and connections between pins of ICs on circuit boards.

2. Description of Related Art

A common way to provide test access to digital pin signals of an IC is to implement digital boundary scan according to the rules defined in the "IEEE Standard Test Access Port and Boundary-Scan Architecture", published in 1990 and 2001, by the Institute for Electrical and Electronic Engineers (IEEE), which is also known as IEEE Std. 1149.1-2001, or simply 1149.1. A dominant characteristic of 1149.1 is the use of a test access port (TAP) controller that has a prescribed state diagram, an Instruction Register (IR), and multiple Data Registers (DR), one of which is the Boundary Scan Register (BSR). FIG. 5 is a state diagram which shows all possible states of an 1149.1 TAP controller.

Note that bond pads of a bare integrated circuit die are eventually connected to the pins of an encapsulating package. Accordingly, in the present disclosure, the terms "pin", "bond pad" and "pad" will be used interchangeably.

Recently, 1149.1 has been shown to be suitable for facilitating reduced pin-count testing of high pin-count ICs, which can significantly reduce the cost of testing the ICs. To enable this method, pin circuitry is first made bidirectional by the provision of input buffers 11 and output drivers 15 connected to bond pad 17, as shown in FIG. 1, and then boundary scan circuitry is added, as shown in FIG. 2. The boundary scan circuitry includes a shift register element 19 for testing the enable input of output driver 15, and a shift register element 21 for testing the data input of driver 15. Register element 21 includes a storage register (not shown) for storing an output data value and/or a captured data value. Output driver 15 is enabled by an enable bit stored in register element 19. The output data value and/or captured data value is stored in the storage register in register element 21. To permit implementation of a HIGHZ instruction defined by 1149.1, a slight modification is needed for the BSR-controlled pad driver circuitry 30 of FIG. 3, to facilitate simultaneously tristating (disabling) all output drivers. The modification comprises an AND gate 23 which receives the output of register 19 and an inverted forceDisable (tristating) signal. Thus, when the forceDisable signal is inactive (logic 0), the state of the enable input of output driver 15 is determined by the output of register 19. An active forceDisable signal is applied to override the output of the shift register.

Applicant's U.S. patent application Ser. No. 09/570,412 filed May 12, 2000, for "Method and Circuit for Testing D.C. Parameters of Circuit Input and Output Nodes" (Applicant's Docket LVPAT017US), now U.S. Pat. No. 6,586,921 B1 granted on Jul. 1, 2003, incorporated herein by reference, discloses a method by which the simultaneous tristate function is tested for unconnected pins of an IC using the timing shown in FIG. 4. In that method, at time $t_1$, the pins are tri-stated in response to an instruction being loaded into the IC. Subsequently, at time $t_D$, the data input to the output drivers is changed. Then, at time $t_2$, the logic value of the pad is captured. If the logic value changed in response to the data input change, then the tristate functionality is defective (for example, forceDisable is stuck at 0), and the chip fails the test. The sequence of states shown in FIG. 4 is in accordance with 1149.1. This test does not, however, test whether the Enable bit in the BSR is stuck on (due to a defect).

To test circuit boards that contain ICs constructed according to 1149.1, different patterns of output driver logic values are shifted into the ICs during the Shift-DR state (the state is re-entered once per bit until all boundary scan bits have been shifted into all ICs), and the resultant logic value on each I/O interconnect is captured during the Capture-DR state. Then, another set of values is shifted in during the next transit through the Shift-DR state.

One problem with this test approach is that the minimum duration of the logic value of each output pin during testing is limited by the time required to reload the boundary scan register. For example, if ten ICs, each with a 100 bit boundary scan chain, are connected in series, then the time to reload the scan chain is one thousand periods of the test clock TCK during the Shift-DR state of the TAP (see FIG. 5). If the clock period is the typical value of one microsecond, then the minimal time to reload the scan chain is one millisecond. Although this is a short time compared to total test time, any high powered pin drivers that are short-circuited for that duration of time may be damaged by the heat generated within its transistors while the abnormally high current is flowing. In some cases, damage can occur in tens of microseconds, and is sufficient to reduce the expected lifetime of the circuit.

Whetsel U.S. Pat. No. 5,706,296 granted on Jan. 6, 1998 for "Bi-directional Scan Design with Memory and Latching Circuitry" proposes a solution to this problem. The proposal includes providing a latching action in the output driver path so that a short circuit causes the driver to stop driving its intended logic value and switches to driving the opposite logic value. This approach requires modifying the driver's circuitry, to insert a delay in the output path, and may flip the driver's state if a very low impedance load is connected that is within specification.

Terayama U.S. Pat. No. 5,736,849 granted on Apr. 7, 1998 for "Semiconductor Device and Test Method for Connection Between Semiconductor Devices" proposes a solution which provides a weak output driver and a strong driver connected in parallel. During test mode, only the weak driver is enabled. As with the Whetsel solution, this circuit requires modification of the driver circuitry, and may not be able to drive a very low impedance load that is within specification.

SUMMARY OF THE INVENTION

The present invention seeks to provide a circuit and a method for testing the function of BSR bits that control the enable input to a driver of unconnected I/O pins of an 1149.1-compliant IC during the IC's reduced pin-count access manufacturing test, and to test the connections to these pins during the test of a circuit board containing the IC, without causing excessive current if a pin is inadvertently short circuited when pin drivers are enabled—the excess current being due to a defect or to too many outputs being enabled simultaneously.

The circuit of the present invention is constructed according to 1149.1, and comprises an IC having a first test mode in which data can be loaded into a BSR without updating the output latches, and a second test mode in which the BSR can be accessed and updated while output pin drivers of the IC are tristated, and circuitry to temporarily de-assert the signal that tristates the pin drivers, at the time that the pins' logic values are captured by the BSR. "Temporarily" means a clock cycle or less and for only a portion of the capture-DR state.

The circuit aspect of the present invention is generally defined as a boundary scan interface circuit for use with a test access port (TAP) controller for testing the state of pin drivers of an IEEE 1149.1-compliant integrated circuit (IC) having a boundary scan register, the interface circuit comprising a tristate control circuit for selectively controlling the pin driver enable input of the pin drivers and responsive to a control input for temporarily de-asserting a signal that tri-states the pin drivers during a capture cycle of the TAP in which pin logic values are captured by the BSR.

The method of the present invention tests that the enable bit path is not stuck in an 'on' state for unconnected pins during reduced pin-count tests of an IC by driving the pins to a selected logic state, then re-loading the BSR with the opposite enable values and opposite data values, simultaneously tristating all pins before updating the outputs, de-asserting the tristate function and capturing the pin logic values while the tristate function is de-asserted.

One embodiment of the method of the present invention is generally defined as a method of testing an integrated circuit to test that boundary scan register pin enable bit paths are not stuck in an "on" state, the method comprising: loading desired circuit pin data and pin driver enable data into a boundary scan register and updating the boundary scan register; loading opposite circuit pin data and the opposite pin driver enable data into the boundary scan register and suppressing updating of the register during a following register update cycle; forcing output drivers into a high impedance state (tristate); updating the data and enable inputs to the output drivers to the said opposite logic values during one of a Run-test/idle or a Select-DR state of a test access port; capturing register outputs; and unloading and comparing captured outputs with expected outputs to determine whether any pin enable bit path is stuck in an "on" state.

Another embodiment of the method of the present invention is generally defined as a method of testing an integrated circuit having a boundary scan register to determine whether circuit output pins have any short circuits between the pins and a power rail, or other high-current output, that might result in the flow of excess current, the method comprising: tristating circuit output pins; loading the boundary scan register with values to force output drivers into desired output states; capturing pin outputs while de-asserting tristating during a capture cycle; and unloading captured data and comparing with expected values.

BRIEF DESCRIPTION OF THE DRAWINGS

These and other features of the invention will become more apparent from the following description in which reference is made to the appended drawings in which.

DETAILED DESCRIPTION OF EMBODIMENTS OF THE INVENTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

Figure 1:
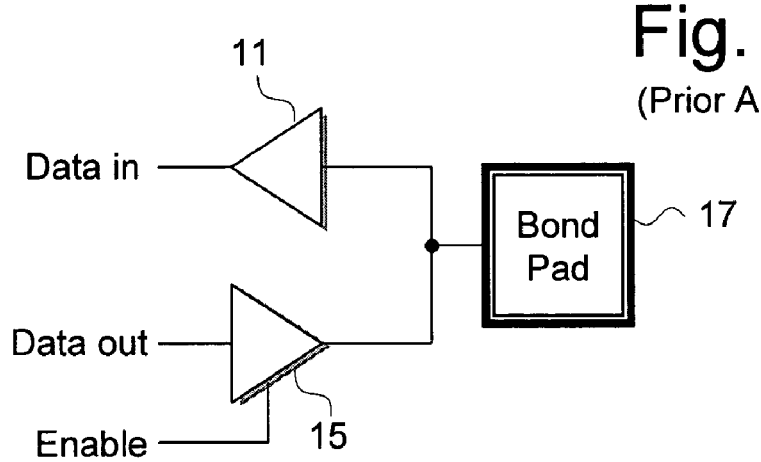
FIG. 1 is a prior art schematic of a bidirectional pin of an IC.
Figure 2:
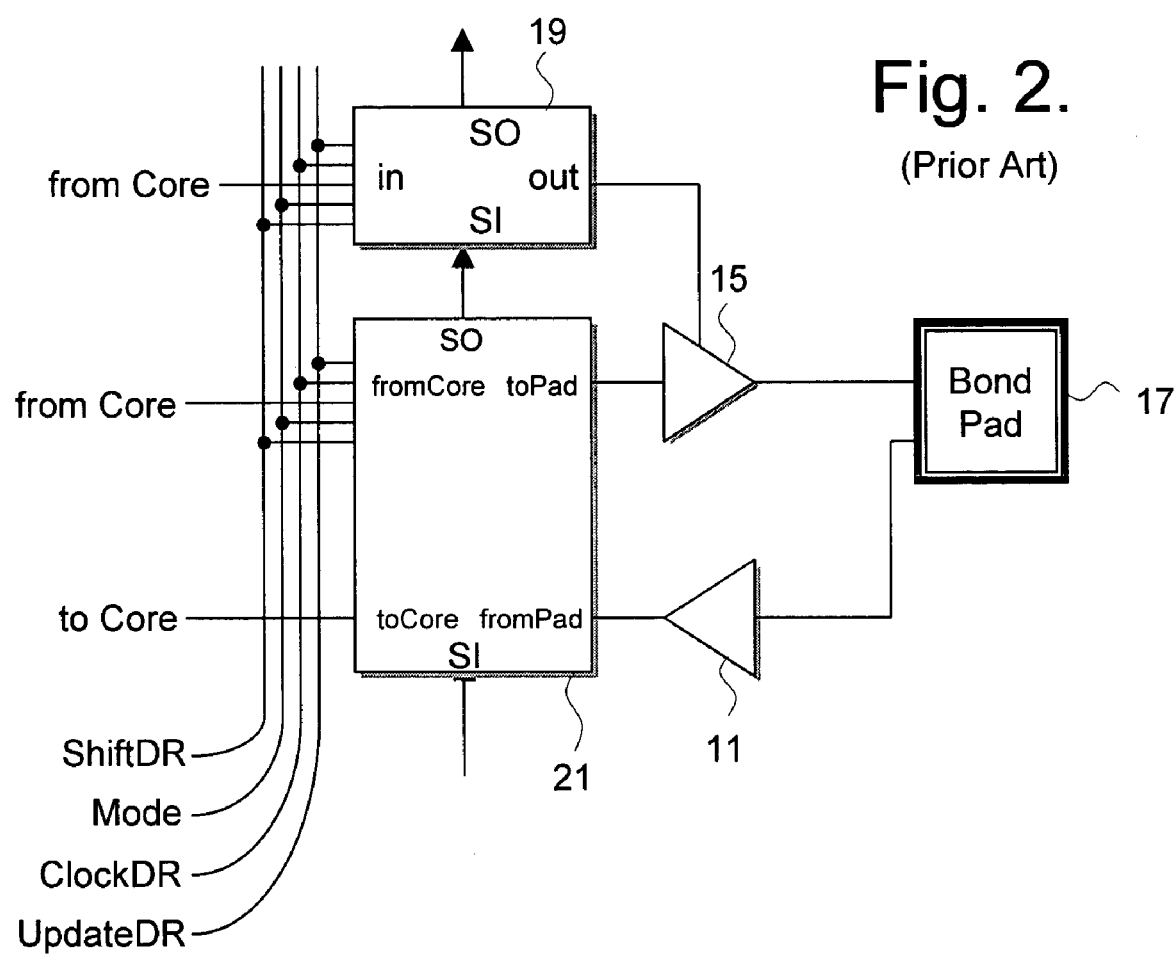
FIG. 2 is a prior art schematic of a bidirectional pin of an IC that has BSR access to and control of the pin.
Figure 3:
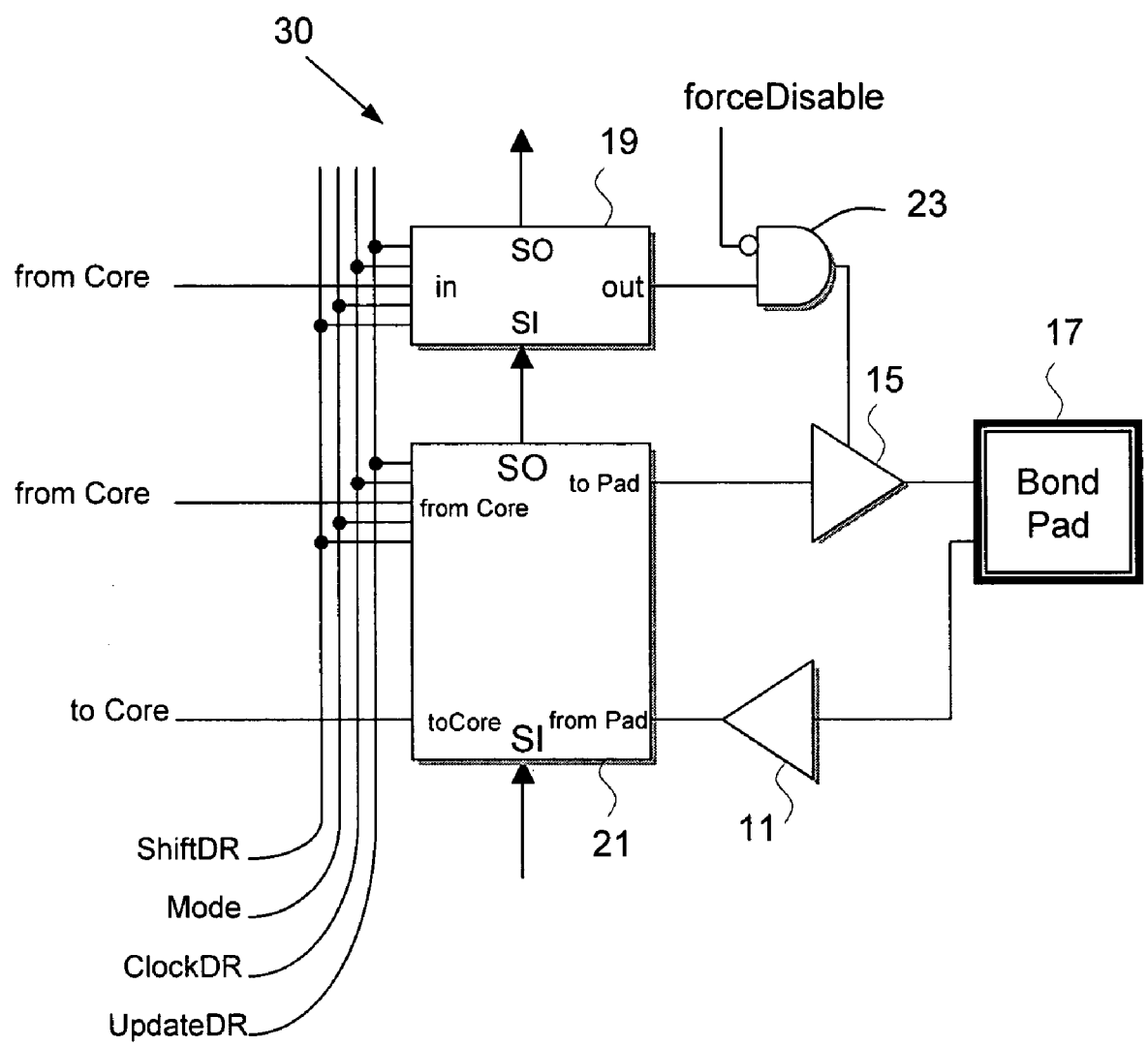
FIG. 3 is a prior art schematic of a bi-directional pin of an IC that has BSR access to and control of the pin, and a tri-stating signal that can simultaneously tristate all such pin outputs.
Figure 4:
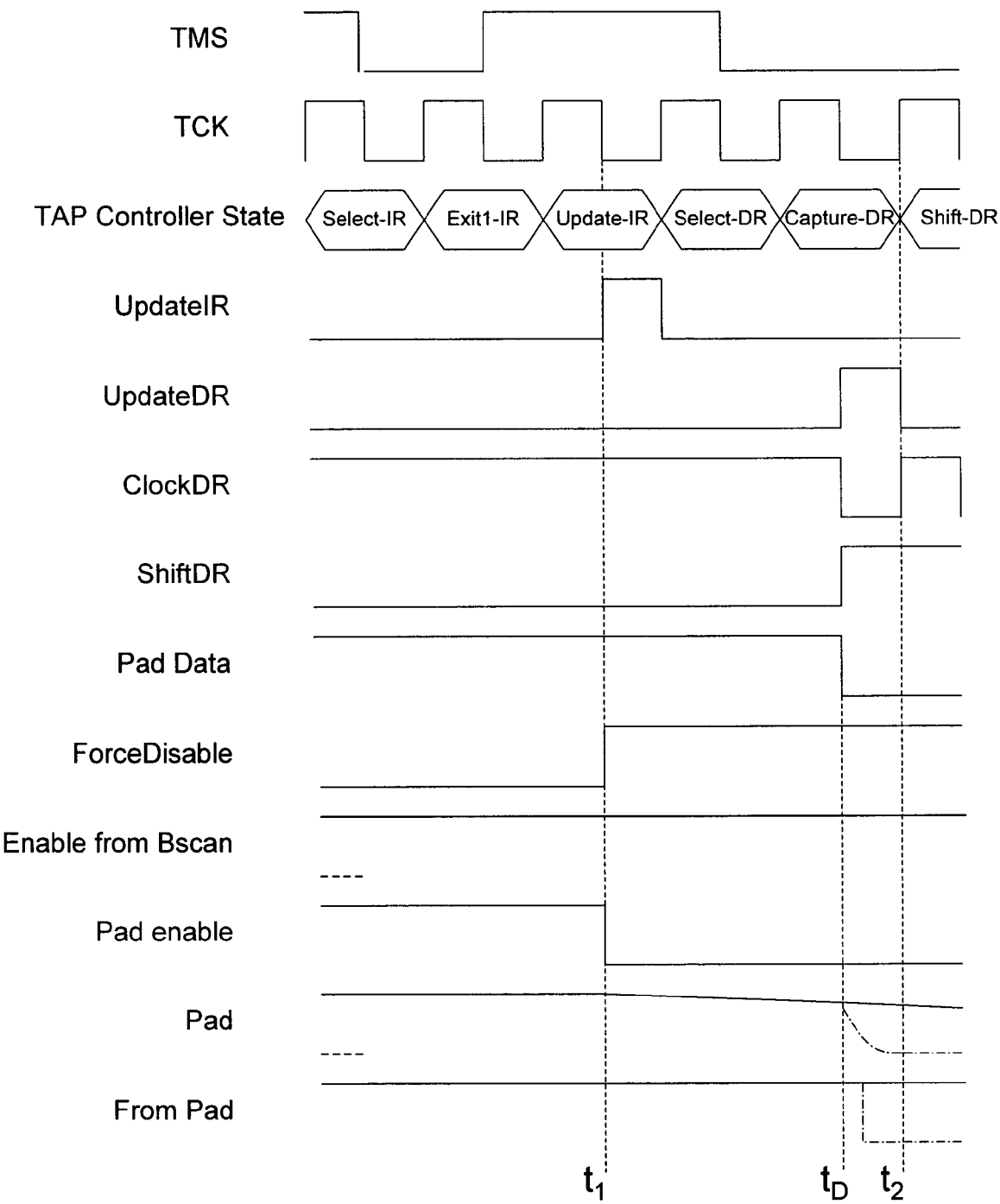
FIG. 4 is a set of waveforms for the circuit of FIG. 3 when a prior art method is used for testing the tristating signal when the pins are not connected directly to a tester.
Figure 5:
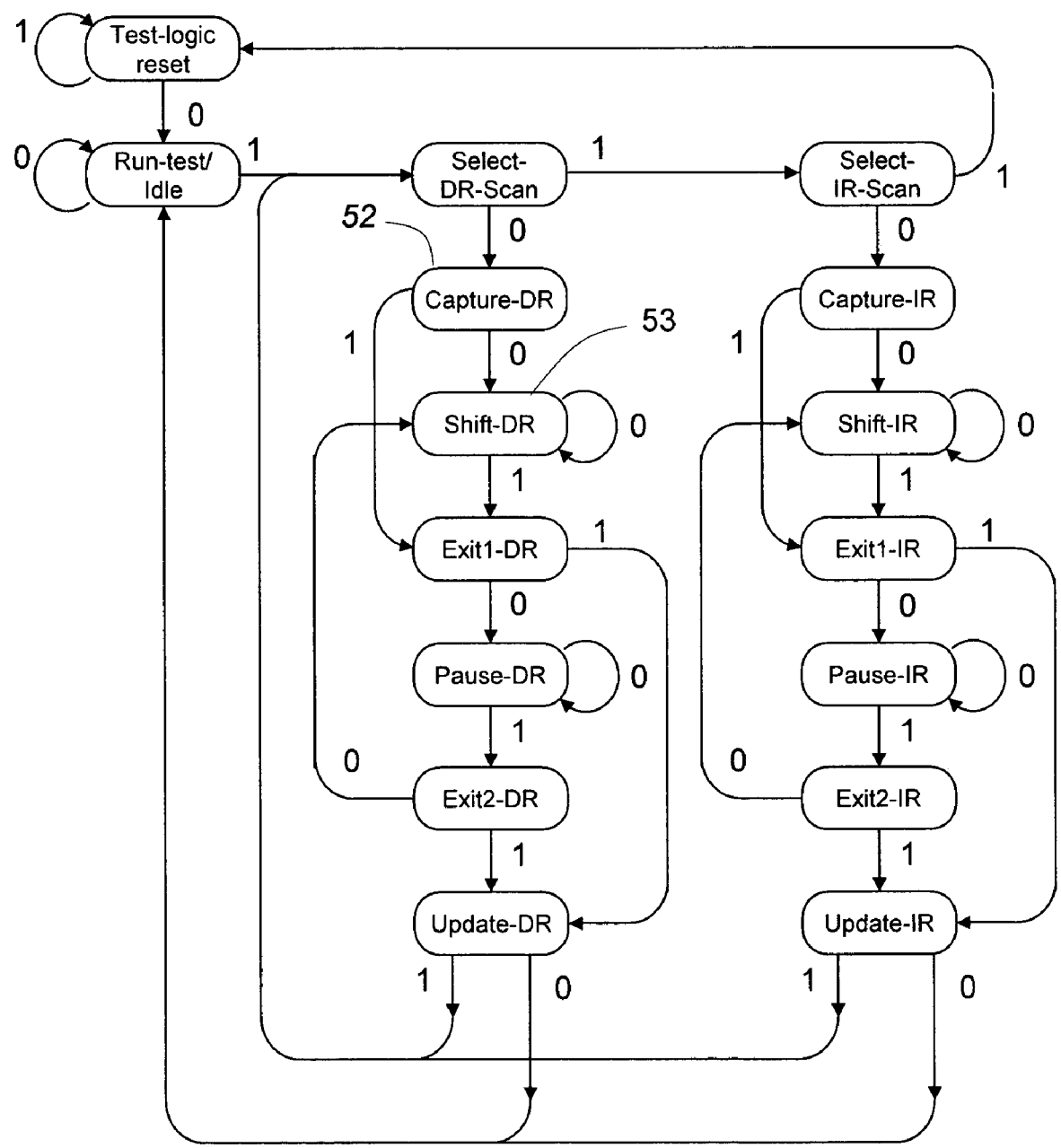
FIG. 5 is a prior art state diagram of the 1149.1 TAP controller.
Figure 6:
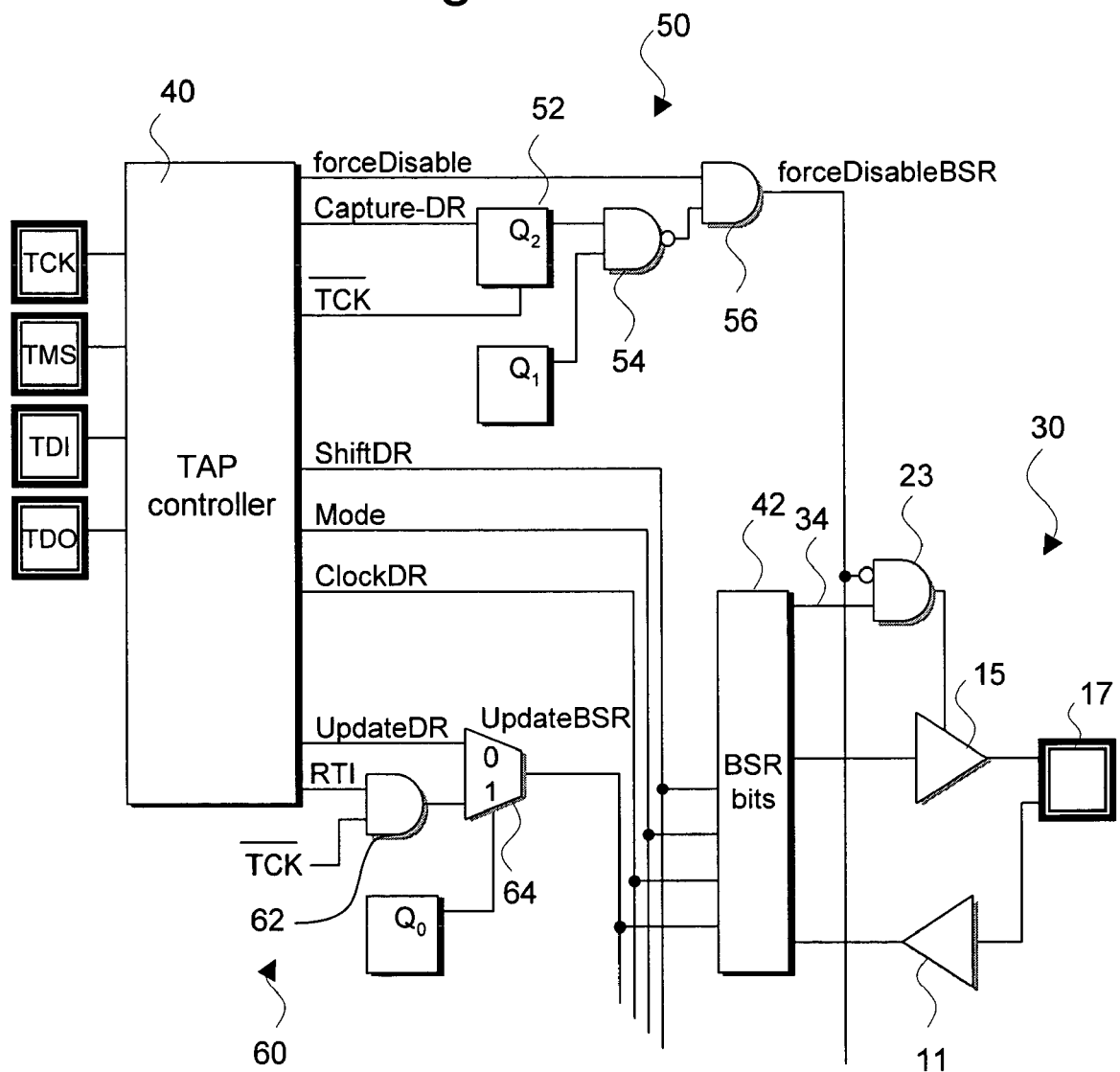
FIG. 6 is a schematic of a circuit according to one embodiment of the present invention.

The circuit of FIG. 6 shows the BSR-controlled pad driver circuitry 30 of FIG. 3 connected to a TAP controller 40 similar to the example TAP controller shown in the 1149.1 standard. The TAP controller typically outputs ShiftDR, Mode, ClockDR, and UpdateDR signals to control the boundary scan cells which form boundary scan register 42. Additional TAP controller outputs include forceDisable, which may be the logic value of a bit in the Instruction Register, Capture-DR which indicates when the TAP controller is in its Capture-DR state, inverted test clock, $\overline{TCK}$; and RTI, which is active (logic 1) when the TAP controller is in the Run-Test/Idle (RTI) state. Many or all of these signals already exist in some TAP controller designs.

The circuit of the present invention is responsive to two more control signals provided by two register bits, $Q_0$ and $Q_1$, which may be part of the TAP instruction register (IR) or part of a data register (DR), but preferably not the BSR. The bits are shown as isolated single-bit registers in FIG. 6 to indicate this generality.

The $Q_1$ bit is a tristate disabling control signal which determines whether the forceDisable signal is to be de-asserted during a TAP Capture-DR controller state. The $Q_0$ bit is an update selector control signal which determines whether update of the BSR is to be delayed, as explained below.

The two bits define two test modes according to the present invention. In a first test mode, both bits are active (logic 1). In the second mode, $Q_1$ is active and $Q_0$ is inactive (logic 0).

In both modes, the output driver tristating signal, force-Disable, is temporarily de-asserted during BSR capture operations. In the first mode, the BSR normal update operation is suppressed or delayed until the next RTI state or select-DR state of the TAP controller. In the second mode, normal update operations are performed during the Update-DR state of the TAP.

Referring to FIG. 6, the $Q_1$ bit is part of a first logic circuit 50 which includes a delay element $Q_2$, in the form of a flip-flop 52, a NAND gate 54 and an AND gate 56.

The $Q_1$ bit is set to logic 1 to enable de-asserting of the forceDisable signal (i.e., forcing it to logic 0) during the TAP controller Capture-DR state when pin logic values are captured by the BSR. NAND gate 54 logically combines the $Q_1$ bit with a delayed Capture-DR state signal output by flip-flop 52. Thus, the output of NAND gate 54 is a pulse that is one test clock (TCK) period in duration and that is applied to one input of AND gate 56. AND gate 56 also receives the forceDisable signal and produces a modified forceDisable signal labeled forceDisableBSR. The Capture-DR signal is delayed by half of a TCK period so that capture occurs substantially in the middle of the clock period within which the tristating signal is de-asserted.

When the TAP controller is in a state other than the Capture-DR state, the output of NAND gate 54 is high (logic 1). The output of AND gate 56 then depends on the value of the forceDisable signal. When forceDisable is high, force-DisableBSR is high, the output of AND gate 23 is low and, thus, output driver 15 is tristated or disabled.

The $Q_0$ bit is part of a second logic circuit 60 which includes an AND gate 62 and multiplexer 64. When $Q_0$ is inactive (logic 0), normal update timing is selected (i.e., in accordance with 1149.1) by multiplexer 64, which outputs a signal labeled UpdateBSR. When $Q_0$ is logic 1, the multiplexer selects the output of AND gate 62 which is a delayed Update pulse which occurs during the RTI state. AND gate 62 logically combines the RTI signal and an inverted test clock signal, $\overline{TCK}$, to produce a pulse that is one half of one test clock period in duration.

First Test Mode

An objective of the present invention is to test that BSR Enable bit path 34 is not stuck in the "on" state. According to the method of the present invention, this is achieved by loading the BSR with pin data and pin driver enable logic values and updating pin outputs; configuring the circuit in the first test mode; re-loading the BSR with data that would cause the output drivers to drive their opposite logic value and to tristate the output drivers, without updating BSR latches; applying an output driver tristating signal to tristate all pins simultaneously; updating BSR latches; and de-asserting the tristating signal, capturing pin logic values in the BSR, and then re-asserting the tristating signal; and unloading the captured data for comparison with expected data.

Figure 10:
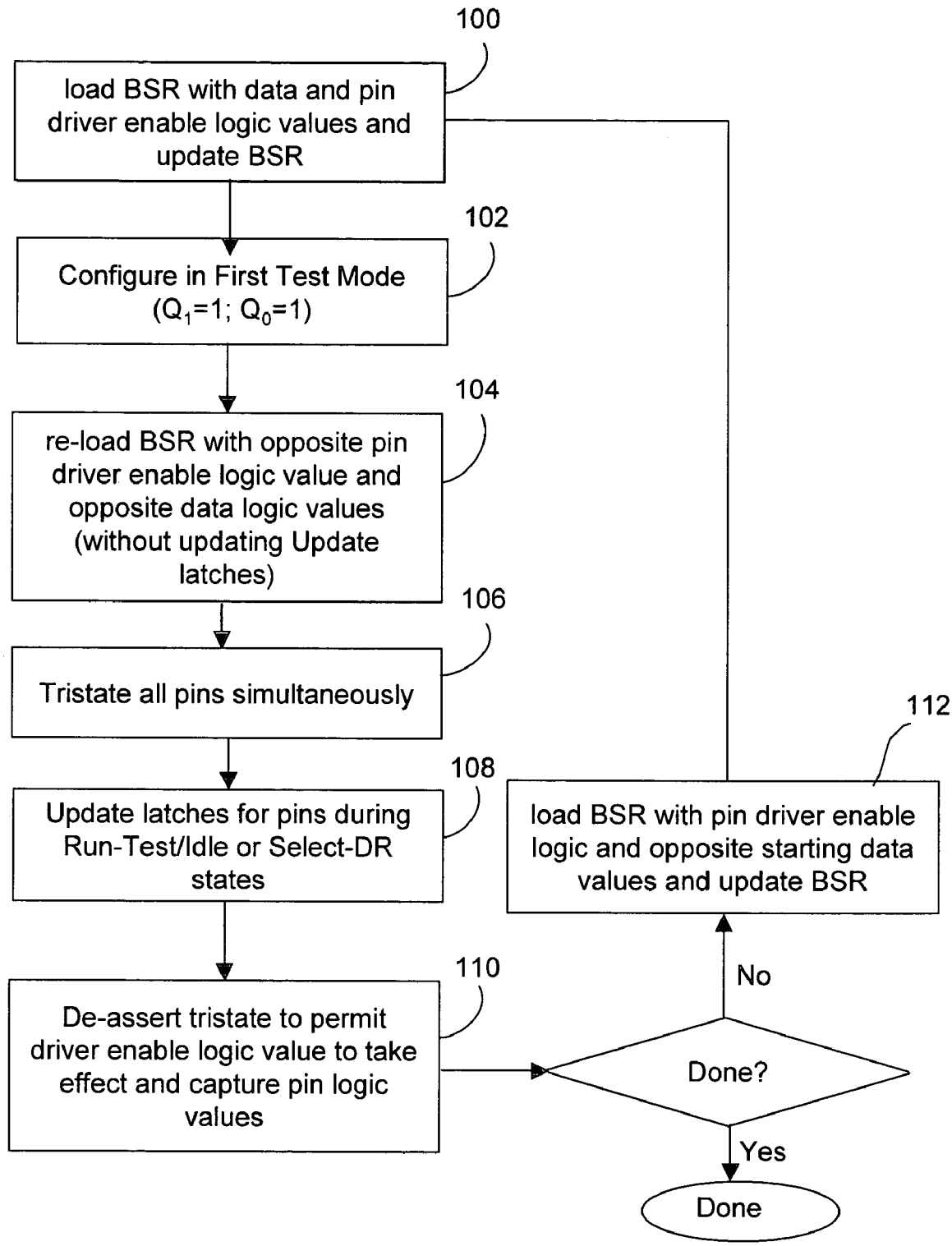
FIG. 10 is a flow chart illustrating a test method for testing the function of an enable bit of a pin driver, according to an embodiment of the present invention.

Referring to FIG. 10, an embodiment of the method to accomplish this objective comprises:

Step 100 involves loading desired driver data and driver enable bits into the BSR and updating the BSR so as to force output drivers to a known driving state such as, for example, driving logic 1 (while Enable is 'on').

Step 102 involves configuring the circuit in a first test mode by setting both register bits Q1 and Q0 to logic 1 which will suppress future updating of BSR latches during the Update-DR state of the TAP, cause future updating of the BSR to occur during the RTI state of the TAP, and de-assert forceDisable during the Capture-DR state. This is achieved by either loading an instruction which includes bits Q1 and Q0 or loading an instruction which accesses a separate data register which includes bits Q1 and Q0.

Step 104 involves reloading the BSR with data that would cause output drivers to drive their opposite logic value and to tristate the outputs (Enable bit is 'off'). In this step, update of the BSR latches is suppressed because $Q_0$ was set active in step 102.

Step 106 involves loading an "EXTESTZ" instruction into the TAP controller instruction register. This instruction (whose name is arbitrary) is the same, in its effect, as the standard EXTEST instruction that selects the BSR to be the active DR, and enables the BSR bits to control output drivers, except that the EXTESTZ instruction forces output drivers into their high impedance state (tristate) by an asserted forceDisable signal.

Figure 7:
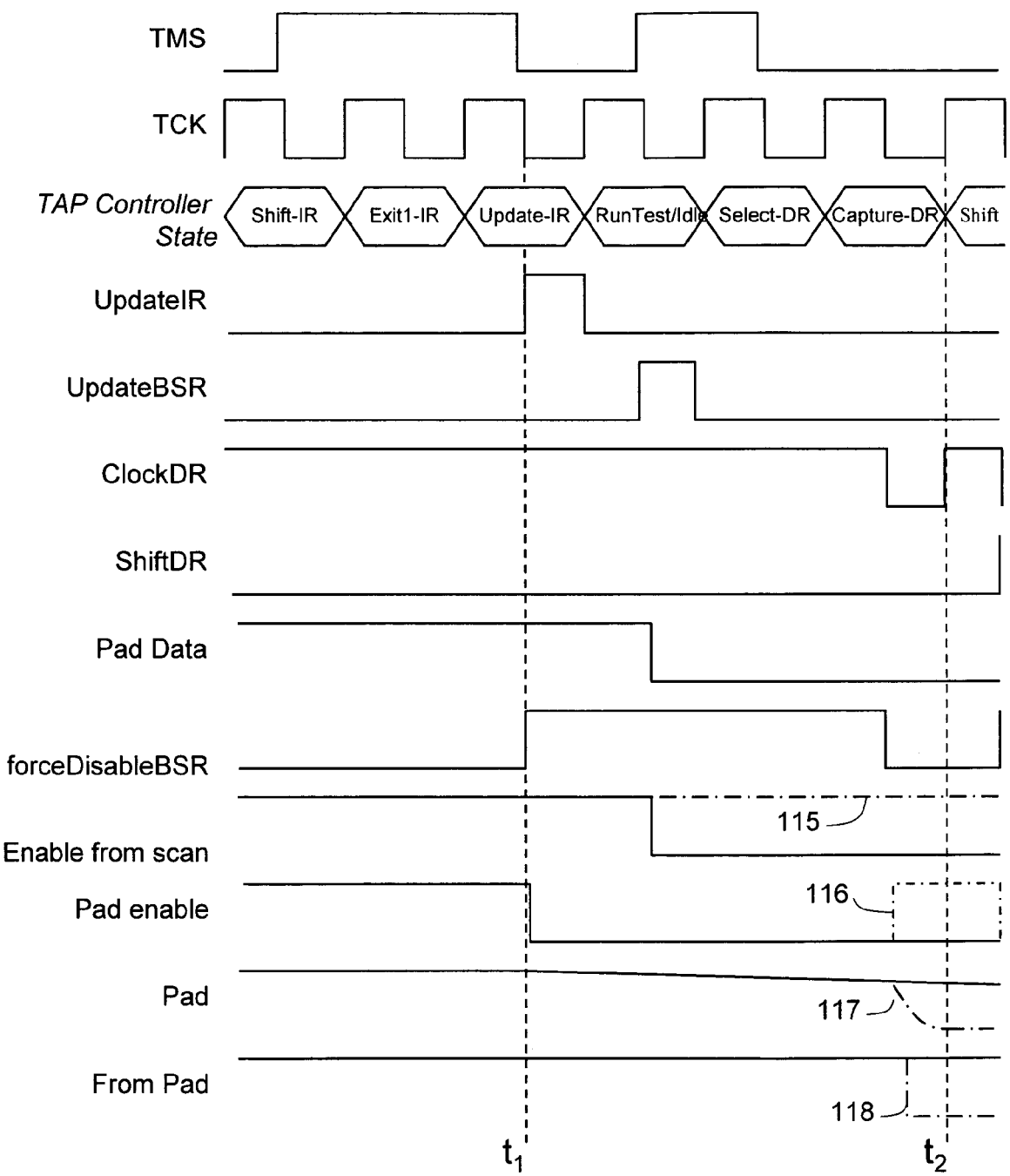
FIG. 7 shows waveforms of the circuit of FIG. 6 when the circuit is used to test the tristate signal according to an embodiment of the method of the present invention.

As shown by the waveforms of FIG. 7, the instruction register is updated with the EXTESTZ instruction at time $t_1$, during the Update-IR state of the TAP, which tristates the outputs at time $t_1$, shown by forceDisableBSR becoming active. It will be noted that the waveforms of FIG. 7 show only the timing-critical portion of the method.

Figure 8:
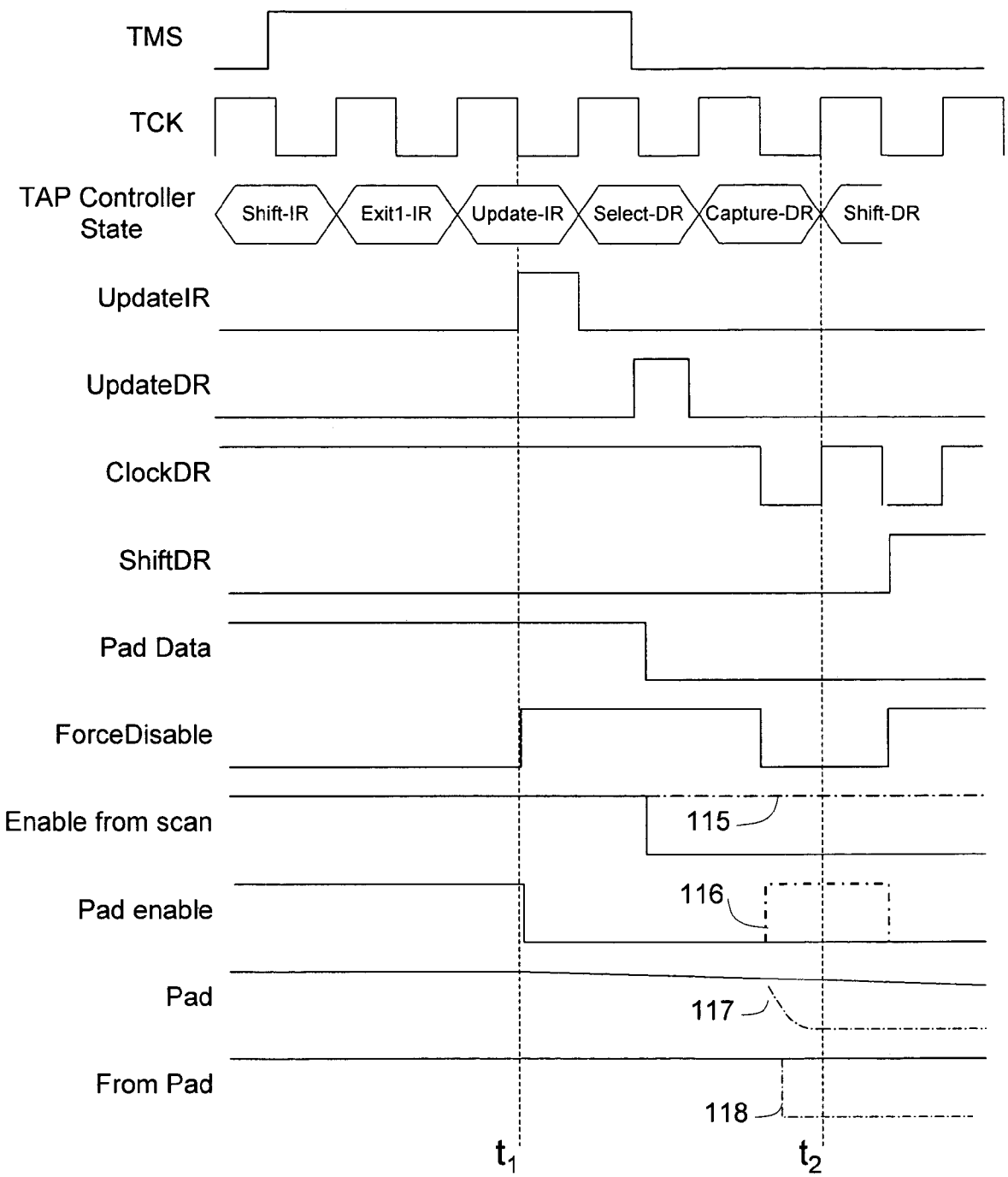
FIG. 8 shows alternative waveforms of the circuit of FIG. 6 when the circuit is used to test the tristate signal according to another embodiment of the method of the present invention.

Step 108 involves updating the Data and Enable inputs to the output drivers to opposite logic values during the RTI state. Alternatively, this update may occur during the Select-DR state, as shown in FIG. 8, so that the RTI state is not needed. The delay in performing the update is to ensure that the update of the Pad Data takes effect after the forceDisable signal becomes active.

Step 110 involves de-asserting ForceDisable during the Capture-DR state, preferably for one TCK cycle, and capturing the logic value of the pin signal by the BSR and shifting out the captured value for comparison with an expected value (logic 1 for this example).

Thus, if the pin enable path is stuck "on", then waveforms 115–118 will occur and the wrong logic value (logic 0 in this example) will be shifted out, indicating that the related pin-driver was erroneously enabled, and so a defect must exist.

The above method may be repeated (step 112), but initially driving the pins to opposite starting values, e.g., to logic 0, instead of logic 1.

Second Test Mode

The present invention also seeks to provide a method of testing whether output pins of an IC that is soldered onto a circuit board has any short circuits between the pins and a power rail, or other high-current output, that might result in the flow of excess current. This can be performed using the above described circuit. This embodiment of the method of the present invention generally comprises tristating the output drivers and then configuring the circuit in the second test mode; loading the boundary scan register with values to force output drivers into desired output states; capturing pin outputs while de-asserting tristating only during the capture cycle; and unloading captured data and comparing with expected values.

Figure 11:
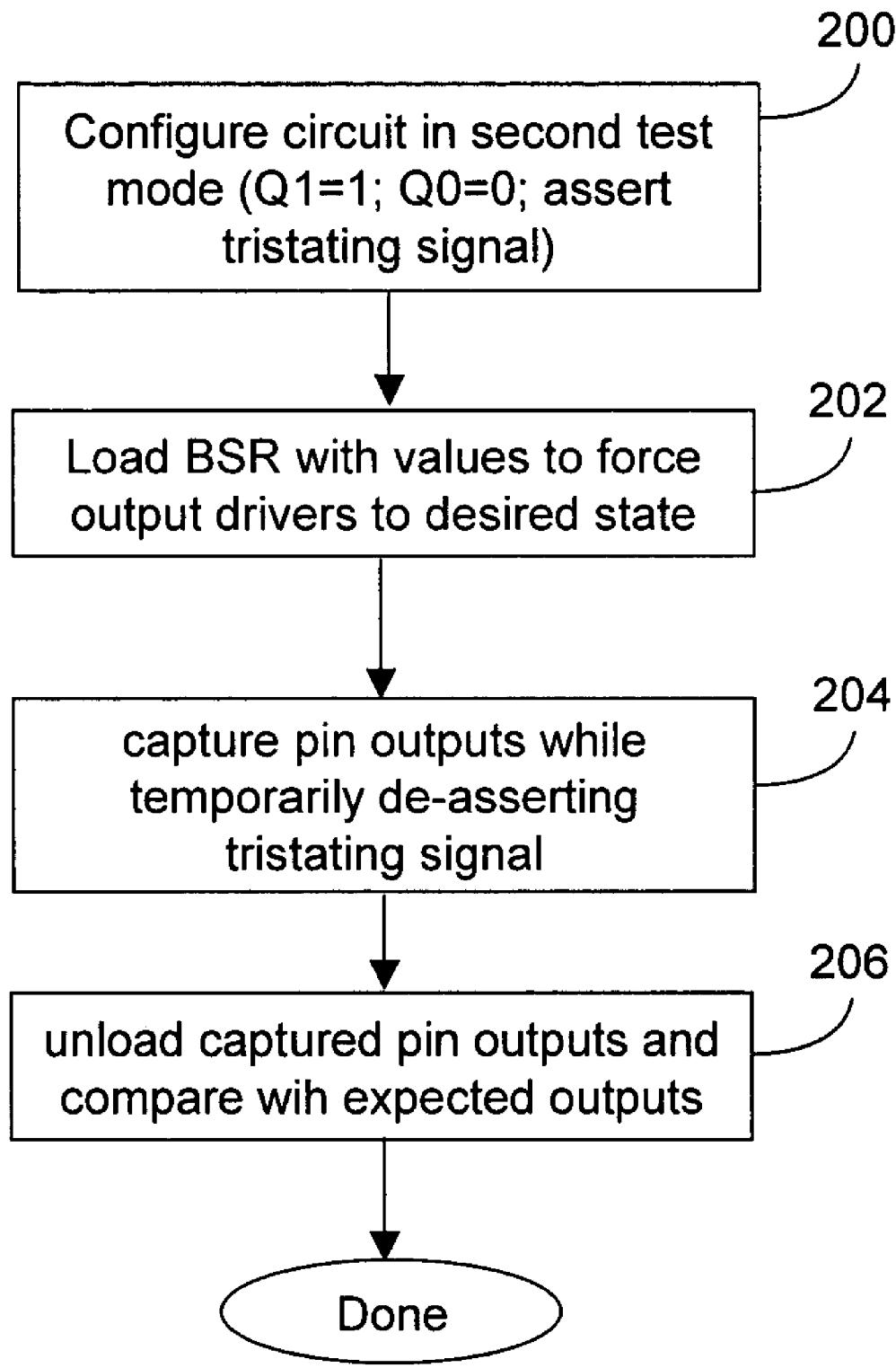
FIG. 11 is a flow chart illustrating a test method for testing whether output pins of an IC, that is soldered onto a circuit board, has any short circuits between the pins and a power rail, or other high-current output, that might result in the flow of excess current.

Referring to FIG. 11, this embodiment of the method is as follows.

Step 200 involves setting register bit $Q_1$ to logic 1, which de-asserts forceDisable during Capture-DR, and register bit $Q_0$ to logic 0, which enables normal BSR update operations during the TAP Update-DR state, and forces output drivers into their high impedance state (tristate) by an asserted forceDisable signal. This is achieved by either loading an instruction for an instruction register that includes bits $Q_1$ and $Q_0$ or loading an instruction which accesses a separate data register which includes bits $Q_1$ and $Q_0$.

Step 202 involves loading bits into the BSR to force output drivers into selected output states (when the forceDisable signal is de-asserted). When the Update-DR pulse state occurs, as shown in FIG. 9, BSR latches are updated, but the output drivers remain in high impedance state (shown symbolically as a mid-rail dash-dot waveform 135) because of the active forceDisable signal.

Figure 9:
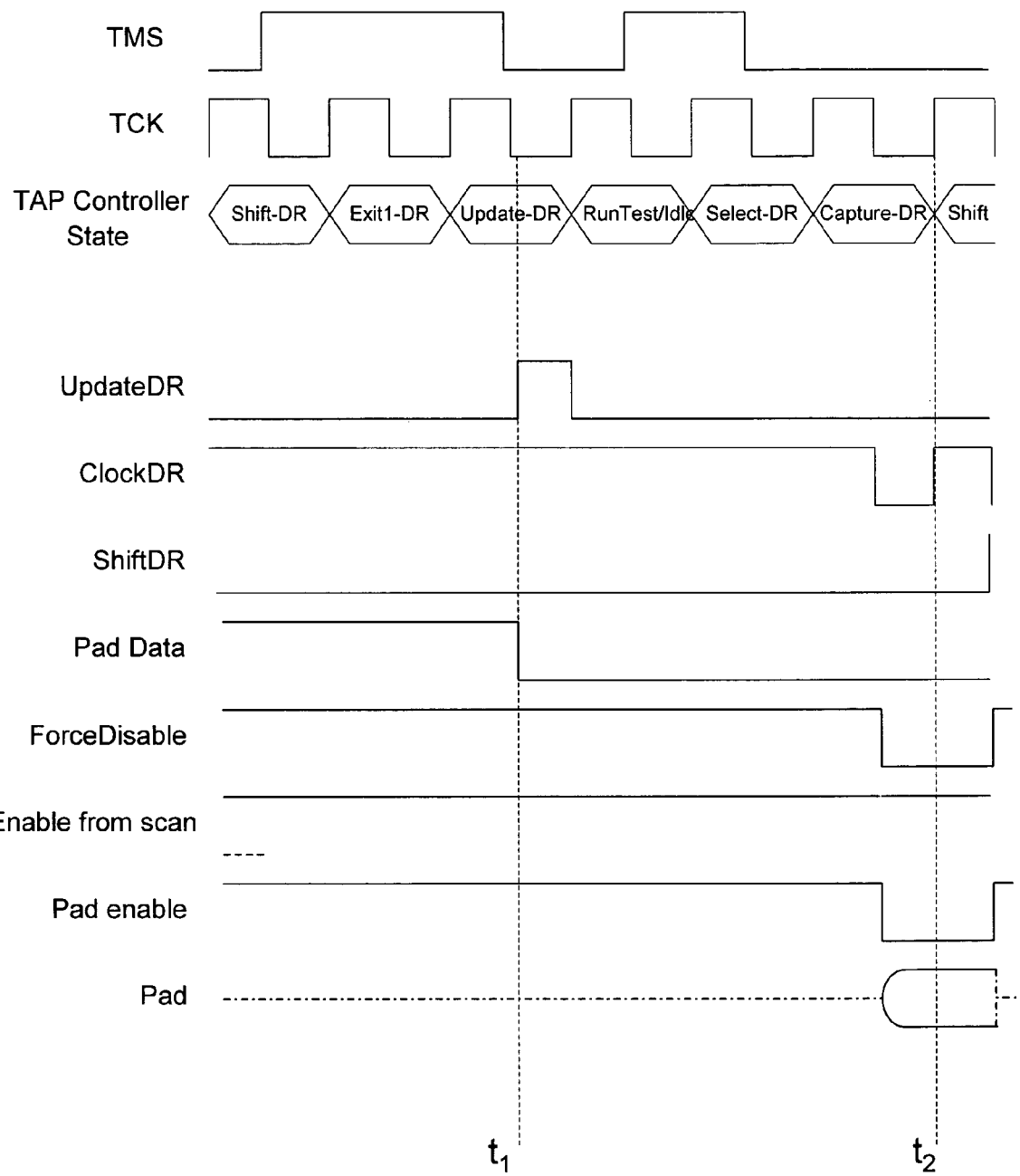
FIG. 9 shows waveforms of the circuit of FIG. 6 when the circuit is used to test connections to the output driver according to another embodiment of the method of the present invention.

Step 204 involves temporarily de-asserting the forceDisable signal during the next Capture-DR state, as shown in FIG. 9, causing the pins to be driven to their intended output states, and capturing the resultant pin logic values in the BSR.

Step 206 involves unloading the captured bits for comparison to expected bit values. According to the 1149.1, new data values for subsequent tests may be shifted in simultaneously with shifting out captured values. Captured logic values which differ from expected values indicate a short circuit.

The method of the present invention may be used for testing a circuit board that has a mixture of circuits, i.e., circuits which incorporate the interface circuit of the present invention and circuits which do not. The method does not require a change in the protocol used to access the BSR of any of the circuits.

In addition to shorts to power rail and high-current output of any circuit, the method allows safely detecting stuck enable bits in integrated circuits which do not implement the method of the present invention but which are connected to circuits which include the circuitry of the present invention. This type of fault might be normally detected by standard 1149.1 boundary scan when a wire is driven simultaneously by a defect-free circuit and by a defective circuit that has its enable stuck "on"; however, if the defect-free circuit embodies the present invention, high current will flow for much less time and thus cause no damage to the defect-free circuit.

Excess current may flow through a pin for other reasons, including inadvertent mechanical connections between a wire and other metallic objects, or due to shorts between wires that travel to other circuit substrates. Excess current may also flow through a power rail when too many output drivers are enabled simultaneously—the present invention greatly reduces the time interval during which the excess current flows, and hence reduces the average current.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A boundary scan interface circuit for pin drivers of an IEEE 1149.1-compliant integrated circuit (IC) having a test access port (TAP) controller and a boundary scan register (BSR), said boundary scan interface circuit comprising:
    a tristate pin driver that can be enabled by said BSR unless a tristate control signal from said TAP controller is asserted;
    a first mode control input signal; and
    a tristate control circuit that, when said first mode control input signal is logic 1, temporarily de-asserts said tristate control signal during a capture state of said TAP controller in which in logic values are captured by the BSR.

2. A boundary scan interface circuit as defined in claim 1, further including:
    a second mode control in input signal; and an update control circuit that, when said second mode control input signal is logic 1, prevents the BSR from being updated during an update state of said TAP controller and instead, delays the update to another state before said capture state.

3. A boundary scan interface circuit as defined in claim 1, said tristate control circuit including:
    first means for combining said first mode control input signal, a TAP controller Capture-DR state signal and a test clock signal to produce a tristate control signal; and
    second means for combining a tristating signal from said BSR and said tristate control signal to produce a pin driver enable signal.

4. A boundary scan interface circuit as defined in claim 3, said pin driver enable signal being a pulse having a duration of one clock period of a test clock.

5. A boundary scan interface circuit as defined in claim 2, said update control circuit including:
    first means for combining a test clock signal and a TAP controller Run-test/idle state signal to produce a delayed update control signal; and
    second means responsive to said second mode control input signal for selecting between a TAP controller Update-DR state signal and said delayed update control signal to produce an update signal to said BSR.

6. A boundary scan interface circuit for use with a test access port (TAP) controller for testing the state of pin drivers of an IEEE 1149.1-compliant integrated circuit (IC) having a boundary scan register (BSR), said interface circuit comprising:
    a tristate control circuit for selectively controlling a pin driver enable input of said pin drivers and responsive to a control input for temporarily de-asserting a signal that tri-states the pin drivers during a capture cycle of said TAP in which pin logic values are captured by the BSR;
    an update control circuit responsive to a second control input for generating a boundary scan cell update signal to provide a first test mode for loading test data into a boundary scan register without updating outputs of said register;
    said update control circuit including means for combining a test clock signal and a TAP Run-test/idle state signal for producing a delayed update control signal; and
    means responsive to a test mode control signal for selecting between a TAP Update-DR state signal and said delayed update control signal for providing an update signal to said BSR.

7. A boundary scan interface circuit as defined in claim 6, said update control circuit including:
    means for combining a test clock signal with one of a TAP controller run-test/idle state signal and a TAP controller select-DR state signal to produce a delayed BSR update control signal; and
    a selector responsive to a test mode control signal for selecting between a TAP update signal and said delayed control signal.

* * * * *